United States Patent
Tokuda

(10) Patent No.: US 6,292,404 B1
(45) Date of Patent: Sep. 18, 2001

(54) SEMICONDUCTOR MEMORY

(75) Inventor: Kimihito Tokuda, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/534,256

(22) Filed: Mar. 24, 2000

(30) Foreign Application Priority Data

Mar. 30, 1999 (JP) .................................................. 11-087622

(51) Int. Cl.[7] .................................................. G11C 7/00
(52) U.S. Cl. .............................. 365/189.05; 365/189.01; 365/189.08
(58) Field of Search ........................ 365/189.05, 189.01, 365/189.08

(56) References Cited

U.S. PATENT DOCUMENTS

| | | | |
|---|---|---|---|
| 4,970,688 | * 11/1990 | Minagawa et al. ............. | 365/189.01 |
| 5,214,777 | * 5/1993 | Curry, Jr. ..................... | 365/189.01 |
| 5,432,743 | 7/1995 | Kusakari ....................... | 365/196 |
| 5,523,981 | 6/1996 | Yamaguchi et al. .......... | 365/233 |
| 5,657,273 | * 8/1997 | Ayukawa et al. ............. | 365/189.01 |
| 5,732,024 | 3/1998 | Sharma et al. ............... | 365/189.05 |
| 5,777,608 | 7/1998 | Lipovski et al. .............. | 345/189 |

* cited by examiner

Primary Examiner—Tan T. Nguyen
(74) Attorney, Agent, or Firm—Foley & Lardner

(57) ABSTRACT

An operation-control circuit for controlling write into a memory cell in a memory cell array is provided between the memory cell array and data input and output buffers. When either /ORE signal or /ANDE signal and WE signal are activated at the time of read cycle, the operation-control circuit conducts OR or AND operation between a data stored in a memory cell array and a data to be written thereinto, and a data in the data input buffer is written into the memory cell array in accordance with the result of the aforementioned logical operation.

3 Claims, 4 Drawing Sheets

FIG. 3A

| OPERATIONAL MODE | FROM BUFFER 3 | /ORE | /WBE | WE | /ANDE | OUTPUT Q OF E | OUTPUT D | OUTPUT C | OUTPUT B | OUTPUT A | DATA OF MEMORY CELL AFTER WRITE |
|---|---|---|---|---|---|---|---|---|---|---|---|
| OR WRITE(1) | L | L | H | H | H | L | L | L | L | NONE | L |
| OR WRITE(2) | L | L | H | H | H | H | L | H | L | NONE | H |
| OR WRITE(3) | H | L | H | H | H | L | H | H | H | H | H |
| OR WRITE(4) | H | L | H | H | H | H | H | H | H | H | H |
| NORMAL WRITE(1) | L | H | L | H | H | L | L | L | L | L | L |
| NORMAL WRITE(2) | L | H | L | H | H | H | H | H | H | L | L |
| NORMAL WRITE(3) | H | H | L | H | H | L | L | L | H | H | H |
| NORMAL WRITE(4) | H | H | L | H | H | H | H | H | H | H | H |
| AND WRITE(1) | L | H | H | L | L | L | L | L | L | NONE | L |
| AND WRITE(2) | L | H | H | L | L | H | H | H | L | NONE | L |
| AND WRITE(3) | H | H | H | L | L | L | L | L | H | L | L |
| AND WRITE(4) | H | H | H | L | L | H | H | H | H | H | H |
| NORMAL WRITE(5) | L | H | H | H | L | L | L | L | L | L | L |
| NORMAL WRITE(6) | H | H | H | H | L | L | H | H | H | H | H |
| NORMAL WRITE(7) | L | H | H | H | L | H | L | H | H | L | L |
| NORMAL WRITE(8) | H | H | H | H | L | H | H | H | H | H | H |

FIG. 3B

| OPERATIONAL MODE | OUTPUT /Q OF E | /ORE | /WBE | WE | /ANDE | OUTPUT Q OF E | OUTPUT D | OUTPUT C | OUTPUT B | OUTPUT A | DATA OF MEMORY CELL AFTER READ |
|---|---|---|---|---|---|---|---|---|---|---|---|
| 1 CLEAR AFTER READ | L | L | H | H | H | H | L | H | L | NONE | H |
| 1 CLEAR AFTER READ | H | L | H | H | H | L | H | H | H | H | H |
| 0 CLEAR AFTER READ | H | H | H | H | L | L | H | L | L | NONE | L |
| 0 CLEAR AFTER READ | L | H | H | H | L | H | H | H | H | L | L |

SEMICONDUCTOR MEMORY

FIELD OF THE INVENTION

This invention relates to a semiconductor memory, and especially to a semiconductor memory having a function of writing a clear data into an address of a memory from which the data has been read.

BACKGROUND OF THE INVENTION

Picture-drawing data of the printer serving as an output apparatus is stored in a page image memory. A process of writing into the page image memory is conducted as follows. An OR operation or an AND operation is conducted between a bit map data drawn up in accordance with the picture-drawing data supplied from a system such as a personal computer etc. and the data is stored in a write memory, and the data is written into a memory cell depending on a result of the aforementioned operation. When the picture-drawing data is completed and outputted to a printing engine, the aforementioned data is cleared to "0" or "1", which is called clear after read.

In case that a DRAM (Dynamic Random Access Memory) is used as the page image memory, writing into the page image memory (the write memory) is conducted in such a way that the data stored in the write memory is once read, an OR operation or an AND operation is conducted between the write data and the aforementioned read-data in an external operational circuit, and the result of the operation is written back to the write memory.

In general, a printing speed of the printer is greatly dependent on the speed of drawing up the picture-drawing data and storing the same in the page image memory. In terminals of a computer system, the speed of printing of the printer is used to characterize the printer class, and improvement of printing speed is greatly demanded. As a method for elevating the printing speed, improvement of the process of drawing up the picture-drawing data can be thought out. From this point of view, it is expected that improvement of process of storing the picture-drawing data (write into the memory) contributes to elevation of the printing speed.

However, in the conventional semiconductor memory, a remedy for storing the picture-drawing data contributing to improvement of the printing speed is not yet investigated, and the speed of writing into the memory still remains slow.

SUMMARY OF THE INVENTION

Accordingly, it is an object of the invention to provide a semiconductor memory in which a writing speed of picture-drawing data is elevated and there by a printing speed of a printer is improved.

According to the feature of the invention, a semiconductor memory comprises:

a memory cell array composed of plural memory cells of a predetermined number which are decoded in row and column directions, a data input memory means for temporarily storing a data to be written into the memory cell array, and an operation-control means which refers to another data read from a memory cell for write in the memory cell array and enable signals concerned with data-writing, and writes the data into the memory cell for write in accordance with a state of the enable signals.

According to the aforementioned structure, the operation-control circuit refers to a combination of enable signals concerned with data-writing and a data in a memory cell for write, and whether the data stored in a data input buffer is written into the memory cell in the memory cell array or not is determined depending on the result of OR or AND operation. As a result, at the time of data-writing into the memory cell array, complicated circuits for OR and AND operations which have been necessary in the conventional semiconductor memory become unnecessary, and the data can be written into the memory cell array equally to the conventional semiconductor memory at the same timing as that of ordinary write by a simple circuit built in the semiconductor memory. Moreover, clear after read for clearing the memory can be conducted by a simple circuit structure.

BRIEF DESCRIPTION OF THE DRAWINGS

The invention will be explained in more detail in conjunction with the appended drawings, wherein.

DESCRIPTION OF THE PREFERRED EMBODIMENTS

Hereafter, an embodiment of the invention will be explained referring to the appended drawings.

Figure 1:
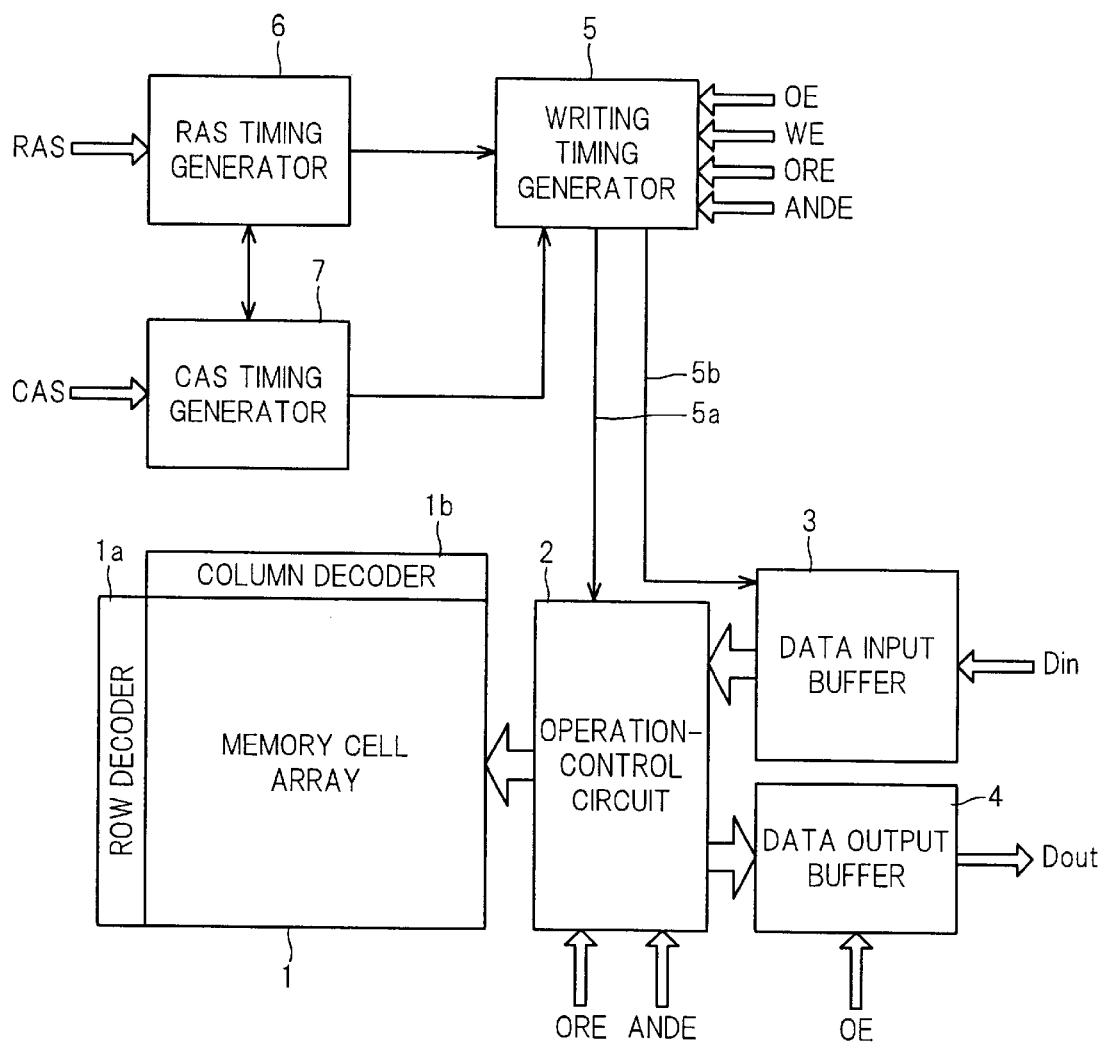
FIG. 1 shows a block diagram for showing a semiconductor memory according to the invention.

FIG. 1 shows a semiconductor memory according to the invention.

An operation-control circuit 2 is connected with a memory cell array 1 provided with a row decoder 1a and a column decoder 1b. A data input buffer (a Din buffer) 3 and a data output buffer a Doubt buffer ) 4 are connected with the operation-control circuit 2. The operation-control circuit 2 and the data input buffer 3 are respectively supplied with control signals 5a, 5b generated by a writing timing generator 5. The writing timing generator 5 is connected with output ports of a RAS (Row Address Strobe) timing generator 6 and a CAS (Column Address Strobe) timing generator 7. OE signal (output enable signal), ORE signal (OR operation enable signal), ANDE signal (AND-operation enable signal) and WE signal (write enable signal) are inputted to the writing timing generator 5. Moreover, a RAS signal is inputted to the RAS timing generator 6, and a CAS signal is inputted to the CAS timing generator 7.

In the structure shown in FIG. 1, the RAS timing generator 6 takes in a RAS signal supplied from the outside, and generates a signal for starting such an action that a data stored in a memory cell in the memory cell array 1, which is communicated with a word line determined by decoding a RAS address, is amplified by a sense amplifier, and read on a bit line. The CAS timing generator 5 takes in a CAS signal supplied from the outside, and outputs a signal to the writing timing generator 5 for starting such an action that a data on a bit line determined by decoding a CAS address is outputted to an I/O line.

The writing timing generator 5 takes in WE signal supplied from the outside, and generates the control signals 5a, 5b for taking in a data inputted to the data input buffer 3 in accordance with output signals of the RAS timing generator 6 and the CAS timing generator 7. Moreover, the writing timing generator 5 generates internal WE signal for writing a clear data into a memory cell in the memory cell array 1 at the time of clear after read, which means the function of writing a clear data (a data of "1" or "0" into the same address after a data is read from a memory cell.

Though the operation-control circuit 2 will be explained in detail later, the operation-control circuit 2 writes a data into the memory cell array 1 referring to a data in a write memory cell at the time of OR-write, AND-write or clear after read, or reads a data in the memory cell array 1 on the data output buffer 4. The data input buffer 3 temporarily stores an input data (a data to be written into the memory cell array 1), and the data output buffer 4 temporarily stores a data read from the memory cell array 1.

Figure 2:
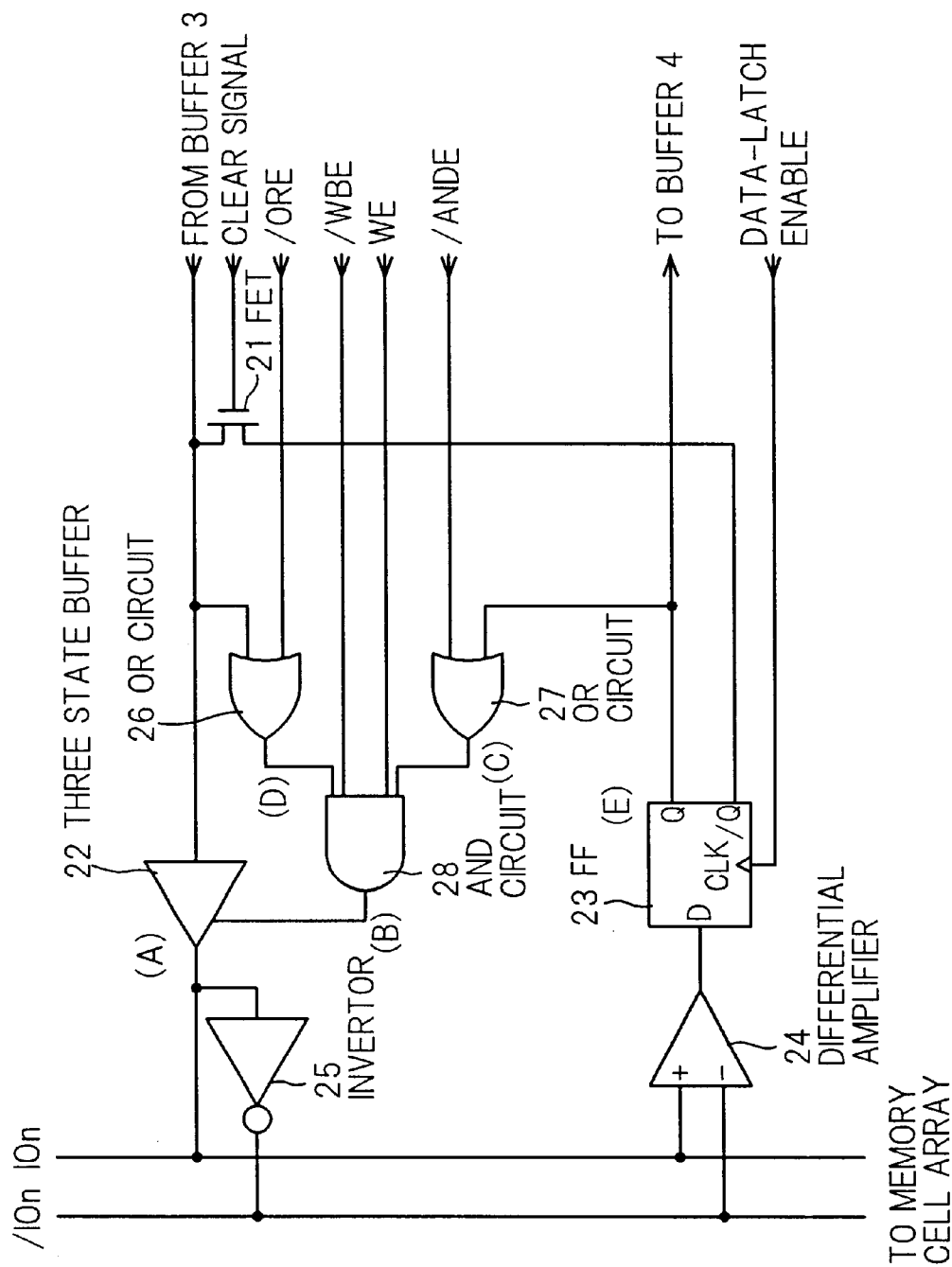
FIG. 2 shows a circuit diagram of an operation-control circuit shown in FIG. 1, FIGS. 3A and 3B show illustrations for explaining operations of various structural elements of an operation-control circuit shown in FIG. 2 in respective operational modes.

FIG. 2 shows the operation-control circuit 2 in detail. Clear signal, /ORE signal, /WBE (WBE bar: write per bit enable) signal, WE signal, /ANDE (ANDE bar) signal, data latch enable signal, etc. are inputted to the operation-control circuit2. A data to be written is outputted to the memory cell array 1 via an input/output lines IOn, /IOn, and a read-data is outputted to the data output buffer 4. /WBE is generated in case that the function of a W/b (write per bit) is used, and makes the buffer on in order to write a data only into a desired bit. This signal is not necessarily needed in the operation of the invention.

The operation-control circuit 2 is provided with a FET 21, a three state buffer 22, a FF (Flip-Flop) circuit 23, a differential amplifier 24, an invertor 25, OR circuits 26, 27 and an AND circuit 28. A clear signal is inputted to a gate of the FET 21, a drain thereof is connected with an input terminal of the three state buffer 22, and a source thereof is connected with a /Q (Q bar) terminal of the FF circuit 23. The input/output lines IOn, /IOn (IOn bar) are connected with input terminals of the differential amplifier 24, and an output terminal thereof is connected with a D terminal of the FF circuit 23. The invertor 25 is connected between the input/output lines IOn, /IOn. The drain of the FET 21 and an input terminal of the /ORE signal are connected with input terminals the OR circuit 26, and input terminals of the OR circuit 27 are supplied with the /ANDE signal and an output signal of a Q terminal of the FF circuit 23. Output signals of the OR circuits 26, 27,/WBE signal, and WE signal are inputted to the AND circuit 28, and the output terminal of the AND circuit 28 is connected with a control terminal of the three state buffer 22. It should be noted that a data stored in a memory cell in the memory cell array 1 is read on the data output buffer 4, which is connected with the terminal Q of the FF circuit 23.

FIGS. 3A and 3B show operational modes of the operation-control circuit 2 shown in FIG. 2. FIG. 3A shows logical levels applied to various parts of the operation-control circuit 2 and states of data in memory cells after write, those being determined in accordance with combinations of input signals of four kinds supplied to the writing timing generator 5, in respective write modes. FIG. 3B shows logical levels applied to various parts for realizing O clear after read and 1 clear after read, and states of data of in memory cells after clear after read. In FIGS. 3A to 3B, output A, output B, output C and output D respectively show outputs of the three state buffer 22, the AND circuit 28, the OR circuit 27 and the OR circuit 26. E means the FF circuit 23. As seen from FIG. 3A, the states of write of sixteen kinds (OR write, And write and NORMAL write) can be realized in accordance with the combination of the input signals of four kinds (/ORE signal, /WBE signal, WE signal and /ANDE signal).

OR write means a write process in accordance with OR logic which is met in case that at least one of a data in a memory cell for write and another data inputted from the data input buffer 3 is "1". Moreover, AND write means a write process in accordance with AND logic which is met in case that both a data in a memory cell for write and another data inputted from the data input buffer 3 are "1". Stillmore, NORMAL write is conducted independently of OR and AND operations.

Next, the operation of the semiconductor memory will be explained referring to FIGS. 2, 3A and 3B. As seen from the FIG. 3A, OR write is conducted by activating /ORE signal (a low logical level) at the time of write cycle. AND write is conducted by activating /ANDE signal (a low logical level) at the time of write cycle. NORMAL write is conducted when both /ORE signal and /ANDE signals are inactivated.

In FIG. 2, if /ORE signal is generated and an input data is "1", OR logic by the operation of the OR circuit 26 is met. If /ANDE signal is generated and a signal is simultaneously generated on the Q terminal of the FF circuit 23, the OR logic by the operation of the OR circuit 27 is met. At this time, if /WBE signal and WE signal are activated and the write cycle has started, AND logic of the AND circuit 28 is met, and an output signal is generated in the AND circuit 28. As a result, the three state buffer 22 operates, and a data inputted from the data input buffer 3 is written into the memory cell array 1 via the three state buffer 22 and the input/output lines IOn, /IOn. In case that AND write is conducted, if a data in a memory cell for write is "0", there is no necessity for changing a content of the memory cell. Accordingly, only in case that the data in the memory cell for write is "1", a data is written into the memory cell for write, and the content of the memory cell for write is changed.

For example, AND write (4) shown in FIG. 3A will be explained. Since /ANDE signal is at a low logical level and OUTPUT Q of the FF circuit 23 is at a high logical level, OUTPUT C of the OR circuit 27 is at a high logical level. Since /ORE signal is at a high logical level, OUTPUT D of the OR circuit 26 is at a high logical level. Since /WBE signal and WE signal are both at a high logical level, all the input signals of the AND circuit 28 are at a high logical level. Accordingly, OUTPUT B of the AND circuit 28 is at a high logical level, the three state buffer 22 is activated, OUTPUT A is at a high logical level, a data of "1" is outputted to the input/output lines IOn,/IOn and the data is written into a memory cell for write in the memory cell array 1.

Next, NORMAL write (4) shown in FIG. 3A will be explained. In case that /ORE signal, /WBE signal, WE signal and /ANDE signal are equally at a high logical level, signals at a high logical level are inputted to the input terminals of the OR circuit 26 (OUTPUT D). Since the OR circuit 27 is supplied with a signal at a high logical level, the output signal of the OR circuit 27 (OUTPUT C) is at a high logical level independently of a state of outputs of the FF circuit 23. Since the output signals of the OR circuits 26,27 /WBE signal and WE signal are entirely at a high logical level, the output of the AND circuit 28 (OUTPUT B) is at a high logical level. The three state buffer 22 supplied with the output signal of the AND circuit 28 (a high logical level) as a control signal outputs a signal at a high logical level, which is inputted from the data input buffer 3. The output of the three state buffer 22 (OUTPUT A) is supplied to the input/output lines IOn, /IOn as a signal of a high logical level. Accordingly, a data in the memory cell is at a high logical level after the data is written into the memory cell array 1.

Processes of write in the other mode are conducted as shown in FIG. 3A in accordance with combinations of respective signals.

Figure 4:
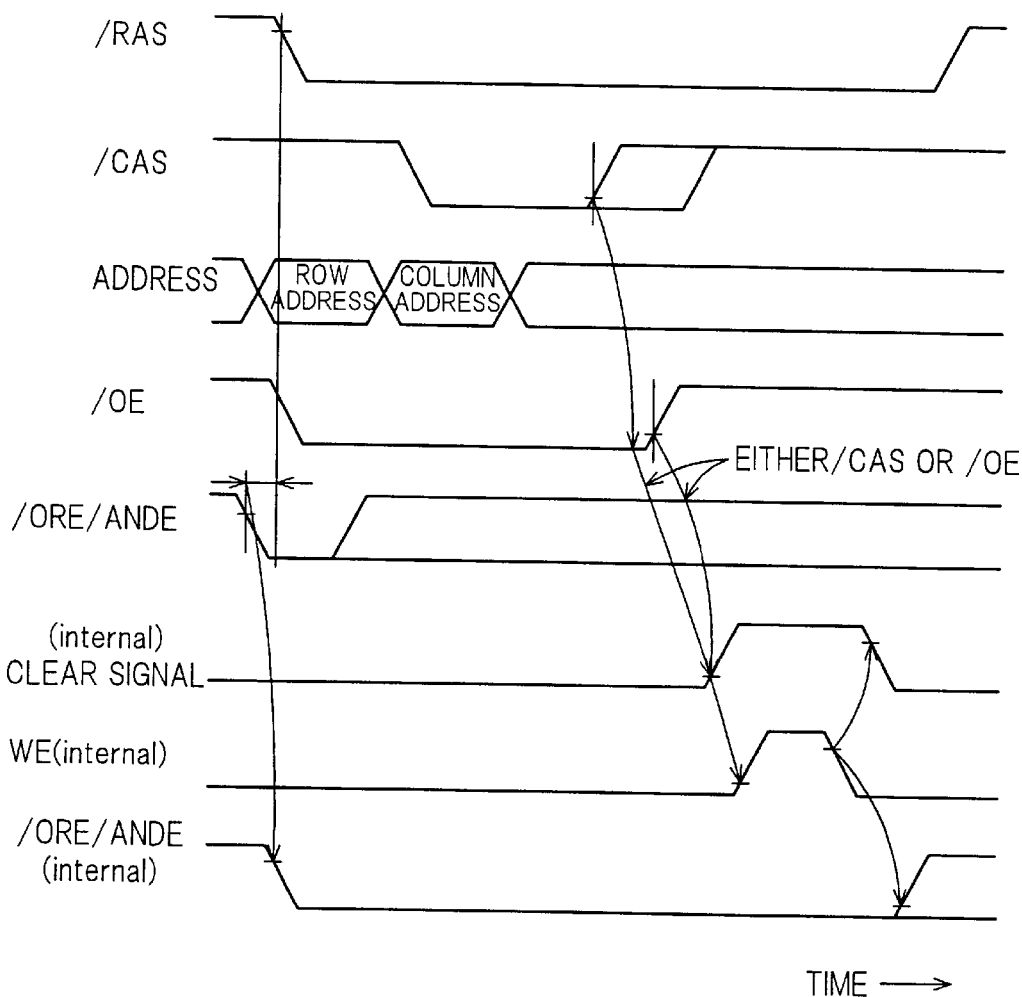
FIG. 4 shows a timing chart of various signals at the time of clear after read.

FIG. 4 shows a timing chart of /ORE signal, /WBE signal, WE signal, /OE signal and /ANDE signal at the time of clear after read.

In a case of clear after read, when /RAS signal is generated in a read cycle as shown in FIG. 4, a row address is accessed. Next, when /CAS signal is generated, a column address is accessed. In this process, either /ORE signal or /ANDE signal is activated earlier, and a clear signal is generated as soon as /OE signal is generated. Thereafter, when WE signal is generated, a write cycle is established. In the write cycle, only when an input data is "1" at the time of OR write or a data in a memory cell for write is "1" at the time of AND write, an output signal from the AND circuit 28 is generated in the three state buffer 22. Thereby, a signal of a high logical level is outputted to the input/output lines IOn, /IOn from the three states buffer 22.

If /ORE signal or /ANDE signal is activated in a read cycle, a clear signal and WE signal are inputted to the operation-control circuit 2 after a data in the memory cell array is read. When clear after read is conducted, the operation-control circuit 2 conducts "1 clear " or "0 clear" in the memory cell array 1. When "0 clear" is conducted in the memory cell array 1, a data of "0" is written only into a memory cell storing a data of "1". In case that 0 clear after read is conducted, AND circuit 28 is activated by generating WE signal after a memory cell for read is read. Thereby, an inverted data of the read-signal is written into the memory cell by the AND circuit 28.

In case that "1 clear" is conducted in the memory cell array 1, a data of "1" is written into only a memory cell storing a data of "0". This write is conducted by means of OR logical circuits. In case that 1 clear after read is conducted, WE signal is generated and the OR logical circuit is activated after a data is read from a memory cell for read. Then, the inverted data of the read-signal is written into the memory cell in accordance with OR logic.

That is to say, in case that /ORE signal or /ANDE signal are inputted in a read mode, when either /CAS signal or /OE signal is inactivated after data-reading is over, the inverted data of the read-data is written into the memory cell, and a clear signal and WE signal, both making the data output buffer4 on, is outputted. Thereby, the inverted data of the read-data is automatically written into the memory cell in accordance with OR logic or AND logic. In case that OR write is conducted, when a data for write is "1" and /ORE signal is established, "1" is written into the memory cell for write in the memory cell array leaving the data for write intact. In case that a data for write is "0", a data stored in the memory cell for write remains unchanged.

The operation of 1 clear after read shown in FIG. 3B will be explained as a concrete example. In case that/ORE signal and OUTPUT /Q of the FF circuit 23 are both at a low logical level and /WBE signal, WE signal and /ANDE signal are equally at a high logical level, since the input terminals of OR circuit 26 are both at a low logical level, OUTPUT D of OR circuit 26 is at a low logical level. Since the input terminals of Or circuit 27 are supplied with OUTPUT Q of the FF circuit 23 (a high logical level), OUTPUT C of the OR circuit 27 is at a high logical level. Since the input terminals of the AND circuit 28 are supplied with /WBE signal (a high logical level), a WE signal (a high logical level), OUTPUT C of the OR circuit 27 (a high logical level) and OUTPUT D of the OR circuit 26 (a low logical level), OUTPUT B of the AND circuit 28 is at a low logical level. Accordingly, the three state buffer 22 is in a high impedance state, and OUTPUT A is not generated even if the input data is "1".

In the aforementioned 1 clear after read, an explanation will be given on a case where the outputs of the FF circuit 23 are inverted. In this case, since OUTPUT /Q of the FF circuit 23 is at a high logical level and OUTPUT Q of the same is at a low logical level, OUTPUT Q (a low logical level) and /ANDE signal (a high logical level) are supplied to the input terminals of the OR circuit 27 and OUTPUT C of the OR circuit 27 is at a high logical level. Since the input terminals of the OR circuit 26 are supplied with /ORE signal (a low logical level) and OUTPUT /Q (a high logical level) via the FET 21, OUTPUT D of the OR circuit 26 is at a high logical level. Since the input terminals of the AND circuit 28 are supplied with OUTPUT C, OUTPUT D, /WBE signal and WE signal, those being at a high logical level entirely, OUTPUT B of the AND circuit 28 is at a high logical level. Accordingly, the three state buffer 22 is activated, an inputted data of "1" passes through passes through the three state buffer 22, and the output thereof (OUTPUT A) is at a high logical level. In this case, the DATA of the memory cell after write is at a high logical level.

Next, 0 clear after read shown in FIG. 3B will be explained. In this case, since OUTPUT /Q of the FF circuit 23 is at a high logical level, the input terminals of the OR circuit 27 are supplied with OUTPUT Q of the FF circuit 23 (a low logical signal) and /ANDE signal (a low logical signal), and OUTPUT C of the OR circuit 27 is at a low logical level. Since the input terminals of the OR circuit 26 are supplied with /ORE signal (a high logical level) and OUTPUT /Q (a high logical level) via the FET 21, OUTPUT D of the OR circuit 26 is at a high logical level. Since the input terminals of the AND circuit 28 are supplied with OUTPUT D (a high logical level), /WBE signal (a high logical level), WE signal (a high logical level) and OUTPUT C (a low logical level), OUTPUT B of the AND circuit 28 is at a low logical level. In this case, since the input data of the three state buffer 22 is "0", the output of the three state buffer 22 (OUTPUT A) is not generated, and the data of the memory cell after write is at a low logical level.

Stillmore, in the aforementioned 0 clear after read, an explanation will be given on a case where the outputs of the FF circuit 23 are inverted. In this case, since OUTPUT /Q of the FF circuit 23 is at a low logical level, the input terminals of the OR circuit 27 are supplied with OUTPUT Q (a high logical level) and /ANDE signal (a low logical level), and OUTPUT C of the OR circuit 27 is at a high logical level. Since the input terminals of the OR circuit 26 are supplied with /ORE signal (a high logical level) and OUTPUT /Q (a low logical level) via the FET 21, OUTPUT D of the OR circuit 26 is at a high logical level. Since the input terminals of the AND circuit 28 are supplied with OUTPUT C, OUTPUT D, /WBE signal and WE signal, those being at a high logical level entirely, OUTPUT B of the AND circuit 28 is at a high logical level. However, since the data inputted to the three state buffer 22 (/Q) is at a low logical level, OUTPUT A of the three state buffer 22 is at a low logical level, hence the data in the memory cell after write is at a low logical level.

According to the aforementioned embodiments, when the data is outputted to the printing engine, the function of clear after read can be fulfilled without using a modified write cycle mode. Explaining concretely, a time necessary for write into the page image memory cell can be reduced by about 200 percent on an average, and read, operations and rewrite can be completed by only a single write. Moreover, a semiconductor memory (DRAM) which does not necessitate circuits for operations of OR, AND and overwrite and a circuit for clear after read can be provided.

As mentioned in the above, since the semiconductor memory according to the invention is provided with a operation-control circuit which refers to a data read from the memory cell for write and the enable signals concerned with data-writing and writes the data into the memory cell for write in accordance with the states of the aforementioned signals, complicated circuits for conducting OR and AND operations which has been necessary in the conventional semiconductor memory becomes unnecessary, and by a simple circuit built in the semiconductor memory, a data can be written into the memory cell equally to the conventional semiconductor memory in which OR and AND operations are conducted at the time of write. Moreover, clear after read for clearing the memory cell can be conducted out putting the data to the printing engine without providing an external additive circuit.

Although the invention has been described with respect to specific embodiment for complete and clear disclosure, the appended claims are not to be thus limited but are to be construed as embodying all modification and alternative constructions that maybe occurred to one skilled in the art which fairly fall within the basic teaching herein set forth.

What is claimed is:

1. A semiconductor memory, comprising:
   a memory cell array composed of plural memory cells of a predetermined number which are decoded in row and column directions,
   a data input memory means for temporarily storing a data to be written into said memory cell array, and
   an operation-control means which refers to another data read from a memory cell for write in said memory cell array and enable signals concerned with data-writing, and writes said data into said memory cell for write in accordance with a state of said enable signals wherein said operation-control means activates either OR operation enable (ORE) signal or AND operation enable (ANDE) signal and write enable (WE) signal in a write cycle,
   conducts OR or AND operation between said data to be written into said memory cell for write and said another data read from a memory cell for write in said memory cell array, and
   writes said data for write supplied from said data input memory means into said memory cell for write in case that said OR or AND logic is met.

2. A semiconductor memory according to claim 1, A semiconductor memory, comprising:
   a memory cell array composed of plural memory cells of a predetermined number which are decoded in row and column directions,
   a data input memory means for temporarily storing a data to be written into said memory cell array, and
   an operation-control means which refers to another data read from a memory cell for write in said memory cell array and enable signals concerned with data-writing, and writes said data into said memory cell for write in accordance with a state of said enable signals wherein:
   said operation-control circuit is composed of:
      a first OR circuit supplied with said another data read from said memory cell array and AND operation enable (ANDE) signal,
      a second OR circuit supplied with either said data supplied from said data input memory means or an inverted data of said another data read from said memory cell array and OR operation enable (ORE) signal,
      an AND circuit supplied with output signals of said first and second OR circuits and write enable(WE) signal,
      a three state buffer which is supplied with an output signal of said AND circuit as a control signal therefore and ON/OFF-controls said data supplied from said data input memory means to said memory cell array, and
      a switching means for applying an inverted data of said another data read from said memory cell array to said three state buffer when a clear signal is inputted.

3. A semiconductor memory according to claim 2, wherein:
   OR logic is met in said first OR circuit when said AND operation enable (ANDE) signal and said another data read from said memory cell array is simultaneously activated,
   OR logic is met in said second OR circuit when said OR operation enable (ORE) signal is activated, and said data supplied from said data input memory means or said inverted data of said another data read from said memory is activated, and
   AND logic is met in said AND circuit when outputs of said first and second OR circuits and said write enable (WE) signal are simultaneously activated.

* * * * *